United States Patent
Gizdarski

(10) Patent No.: US 11,740,288 B1
(45) Date of Patent: Aug. 29, 2023

(54) LOCALIZATION OF MULTIPLE SCAN CHAIN DEFECTS PER SCAN CHAIN

(71) Applicant: Synopsys, Inc., Mountain View, CA (US)

(72) Inventor: Emil I. Gizdarski, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/828,780

(22) Filed: May 31, 2022

Related U.S. Application Data

(60) Provisional application No. 63/196,111, filed on Jun. 2, 2021.

(51) Int. Cl.
    *G01R 31/3185* (2006.01)

(52) U.S. Cl.
    CPC ............ *G01R 31/318536* (2013.01); *G01R 31/318544* (2013.01); *G01R 31/318552* (2013.01)

(58) Field of Classification Search
    CPC .... G01R 31/318536; G01R 31/318544; G01R 31/318552
    USPC ................................ 714/731, 726, 729, 744
    See application file for complete search history.

(56) References Cited

U.S. PATENT DOCUMENTS

| | | | | |
|---|---|---|---|---|
| 7,299,391 B2* | 11/2007 | Tseng | ............ | G01R 31/318569 714/729 |
| 11,288,428 B1* | 3/2022 | Gizdarski | ............ | G06F 30/333 |
| 2004/0081208 A1* | 4/2004 | Tseng | ............ | G01R 31/318569 370/532 |
| 2007/0234169 A1* | 10/2007 | Rajski | ............ | G01R 31/31727 714/742 |
| 2010/0218061 A1* | 8/2010 | Sinanoglu | ...... | G01R 31/318547 714/E11.155 |
| 2012/0242368 A1* | 9/2012 | Nozuyama | ............ | G06F 30/30 716/101 |
| 2016/0003902 A1* | 1/2016 | Maliuk | ......... | G01R 31/318519 714/727 |
| 2022/0065926 A1* | 3/2022 | Chakrabarty | ...... | G01R 31/3177 |
| 2022/0120809 A1* | 4/2022 | Porst | .................. | G01R 31/3177 |

* cited by examiner

*Primary Examiner* — John J Tabone, Jr.
(74) *Attorney, Agent, or Firm* — Park, Vaughan, Fleming & Dowler LLP; Laxman Sahasrabuddhe

(57) ABSTRACT

Scan cells of a set of scan chains may be partitioned into at least two control groups of scan cells and at least two observe groups of scan cells. Adjacent scan cells in the set of scan chains may belong to different control groups. Each observe group may include at most one scan cell from each control group, and each control group may include at most one scan cell from each observe group. The control groups and observe groups may be used to perform defect localization on the set of scan chains.

20 Claims, 14 Drawing Sheets

| Comb | s-a-0 x0 | s-a-1 x1 | s-t-r x2 | s-t-f x3 | s-t-rf x4 | f-t-r x5 | f-t-f x6 | f-t-rf x7 | Linear equations |
|---|---|---|---|---|---|---|---|---|---|
| 000 | | | | | | | | | x1 |
| 001 | 1 | 1 | | | 1 | | | | x0 ⊕ x3 ⊕ x4 |
| 010 | | 1 | 1 | 1 | 1 | 1 | | 1 | x1 ⊕ x2 ⊕ x4 ⊕ x5 ⊕ x7 |
| 011 | 1 | | | | | | | | x0 |
| 100 | | 1 | | | | | | | x1 |
| 101 | 1 | 1 | | 1 | 1 | | 1 | 1 | x0 ⊕ x3 ⊕ x4 ⊕ x6 ⊕ x7 |
| 110 | | 1 | 1 | | 1 | | | | x1 ⊕ x2 ⊕ x4 |
| 111 | 1 | | | | | | | | x0 |

LOCALIZATION OF MULTIPLE SCAN CHAIN DEFECTS PER SCAN CHAIN

RELATED APPLICATION

This application claims the benefit of U.S. Provisional Application Ser. No. 63/196,111, filed on 2 Jun. 2021, the contents of which are herein incorporated by reference in their entirety for all purposes.

TECHNICAL FIELD

The present disclosure generally relates to integrated circuit (IC) design and test. More specifically, the present disclosure relates to localization of multiple scan chain defects per scan chain in an IC design.

BACKGROUND

Testing IC designs is important to ensure that the IC designs operate as desired. IC designs may include circuitry to facilitate fault diagnosis and testing of IC chips. Specifically, an IC design may include scan chains that may be used to scan in test stimuli and scan out test responses. Each scan chain may include a chain of scan cells, and each scan cell may include a register and a multiplexer.

SUMMARY

Embodiments described herein may feature systems and techniques for localization of multiple scan chain defects per scan chain in an IC design. Scan cells of a set of scan chains may be partitioned into at least two control groups of scan cells and at least two observe groups of scan cells. The control groups may include a subset of scan cells in the set of scan cells for which defect location is desired to be performed. Adjacent scan cells in the set of scan chains may belong to different control groups. Each observe group may include at most one scan cell from each control group, and each control group may include at most one scan cell from each observe group. The control groups and observe groups may be used to perform defect localization on the set of scan chains.

In some embodiments described herein, the observe groups may include scan cells in different shift cycles and the defect localization may be performed based on multiple measurements per pattern from observe groups that includes a defective scan cell.

In some embodiments described herein, the control groups may be non-overlapping with each other, and the observe groups may be non-overlapping with each other.

In some embodiments described herein, using the control groups and observe groups to perform defect localization on the set of scan chains may include applying one or more capture patterns to the set of scan chains. Specifically, (1) a first value corresponding to a capture pattern may be loaded into scan cells of a control group, (2) the set of scan chains may be shifted through at least one clock pulse, (3) outputs of scan cells of the observe group may be combined (e.g., by performing an exclusive-OR operation) to generate an observe group output, and (4) the observe group output may be unloaded.

In some embodiments described herein, the scan cells in the control group may receive the first value during a first clock pulse, and the set of scan cells may propagate data through the set of scan chains during a second clock pulse.

In some embodiments described herein, using the control groups and observe groups to perform defect localization on the set of scan chains may include creating a system of linear equations, and solving the system of linear equations. In some embodiments described herein, variables in the system of linear equations may correspond to potential defect locations, equations in the system of linear equations may correspond to capture patterns, and each equation of the system of linear equations may include variables that correspond to the potential defect locations that are detected by the corresponding capture pattern.

BRIEF DESCRIPTION OF THE FIGURES

The disclosure can be understood based on the detailed description given below and the accompanying figures. The figures, examples and embodiments are for illustrative purposes, and do not limit the scope of the disclosure. Furthermore, the figures are not necessarily drawn to scale.

FIG. 13 illustrates the sensitization conditions for different fault types in accordance with some embodiments described herein.

DETAILED DESCRIPTION

An IC chip that includes DFT circuitry may be tested by applying test patterns (which may be generated by using Automatic Test Pattern Generation (ATPG)) to the IC chip, and comparing responses generated by the IC chip with expected responses. A test fails when a response outputted by the IC chip does not match an expected response. If a defect exists in a scan cell, it is desirable to uniquely identify the defective scan cell, and this process or this ability is known as localization of scan chain defects.

The term "resolution" refers to the extent to which a scan chain enables localization of scan chain defects to specific scan cells based on test responses. A scan chain is said to have a low resolution if the scan chain does not enable unique localization of a defective scan cell when a defect exists in the scan chain. Chain defects may be classified into the following fault types based on the defect behavior: stuck-at, slow, and fast. The fault types model (or specify) the defect behavior for purposes of ATPG and diagnosis. A particular defect may cause different fault types depending on how the defect affects the behavior of the scan chain.

Localization of multiple scan chain defects is important in early stages of developing new technology nodes. Simulation-based methods for localization of scan chain defects may inject certain fault types and fault simulation of a range of scan cells of a defective scan chain. Simulation-based methods may achieve a high accuracy and good resolution for localization of multiple scan chain defects in case of a single defect per chain. However, a unique localization for scan chain defects may be impossible when two or more scan cells produce same test responses. Chain diagnosis and chain resolution may become more challenging in case of multiple scan chain defects and multiple defects per chain.

Some DFD approaches focus on completeness for test chips and an area overhead for production chips. Localization of scan cell defects allows the defects to be specifically identified and analyzed, which may then allow solutions to be found to fix the defects. In some approaches, the localization for multiple defects per chain may be improved by using opposite directions for loading data into and unloading data from a scan chain. In some approaches, the localization for multiple defects per chain may be improved by using multiple scan paths. In some approaches, a unique localization of a single defect per chain may be achieved by adding set-reset logic.

Figure 1:
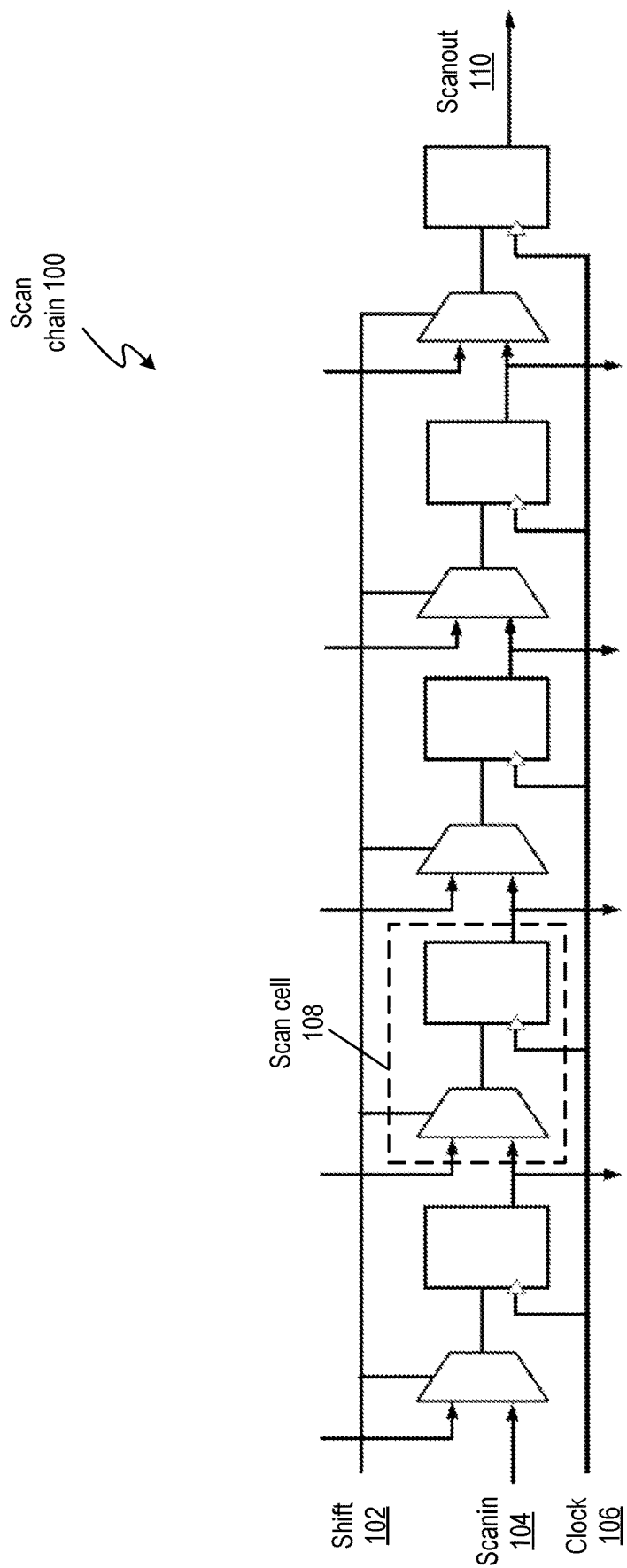
FIG. 1 illustrates a scan chain in accordance with some embodiments described herein.

FIG. 1 illustrates a scan chain in accordance with some embodiments described herein.

Scan chain 100 may include scanin pin 104, a series of scan cells (e.g., scan cell 108), scanout pin 110, clock pin 106, and shift pin 102. Each scan cell (e.g., scan cell 108) includes a multiplexer and a register. The terms "register" and "flip-flop" are used interchangeably in this disclosure. A clock signal received on clock pin 106 may be provided to the registers in scan chain 100. A select signal provided to shift pin 102 may be used to operate scan chain 100. Specifically, when a first signal (e.g., 0) is provided to shift pin 102, the registers in scan chain 100 are coupled to the inputs and outputs of logic clouds (not shown in FIG. 1). On the other hand, when a second signal (e.g., 1) is provided to shift pin 102 the registers in scan 100 are coupled in series to enable data to be shifted through scan chain 100.

Two types of patterns may be used for defect localization. Chain test patterns may be performed by loading test stimulus in the scan cells and unloading test response from the scan cells. The scan cells may be numbered in decreasing order from left to right. Thus, if scan cell 108 is the kth scan cell, then the scan cell to its right is the (k−1)th scan cell and the scan cell to its left is the (k+1)th scan cell. The loading test stimulus of pattern N and the unloading test response of a pattern N−1 may be simultaneously performed during a shift operation (e.g., when the second signal is provided to shift pin 102). Chain test patterns may be used for identification of defective scan chains and corresponding fault types. Capture patterns may be obtained by loading test stimulus in the scan cells, applying one or more capture clock pulses, and unloading test response from the scan cells. Capture patterns may be used for defect localization by simulating fault effects and calculating ranking scores for all potential defect locations.

Figure 2:
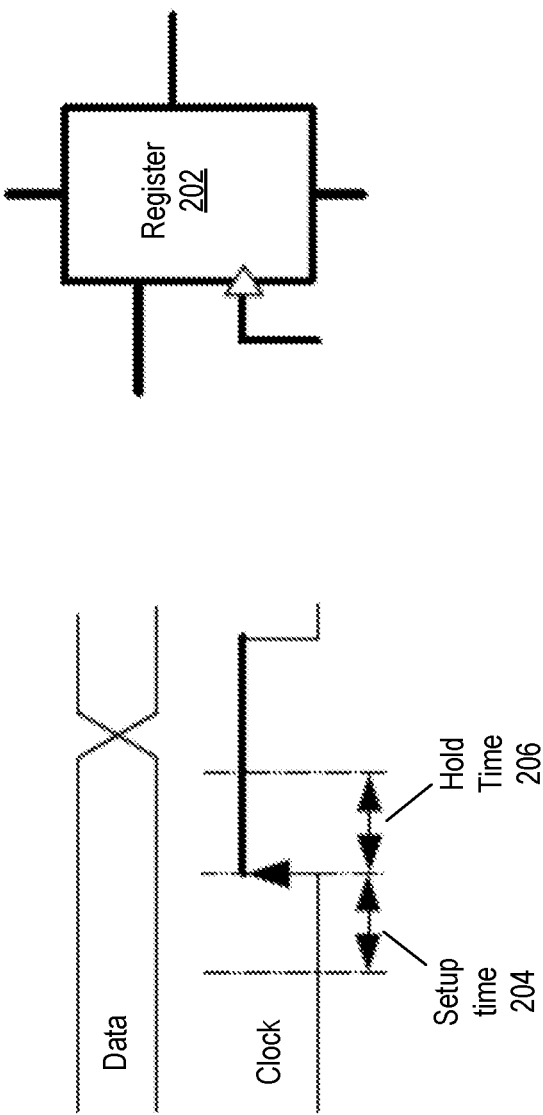
FIG. 2 illustrates timing for a register during shift operation in accordance with some embodiments described herein.

FIG. 2 illustrates timing for a register during shift operation in accordance with some embodiments described herein.

To ensure correct shift operation, a data input of each register (e.g., register 202) may desired to have a stable value during both setup-time 204 and hold-time 206. A fault-free shift operation ensures that the current value of scan cell k is captured by scan cell k−1 at the end of each shift cycle. As a result, the new value of scan cell k−1 is the old value of scan cell k at the end of each shift cycle. A hold-time violation exists when data input of a register in a scan path changes during the hold-time (i.e., the data input switches from the current value to the new value of the previous scan cell within the hold-time period). As a result, the corresponding scan cell incorrectly captures a new value of the previous scan cell instead of the current value. A fault model used in simulation-based chain diagnosis may include fast-to-rise, fast-to-fall, and fast-to-rise-and-fall fault types to represent this defect behavior.

A setup violation exists when data input of a register in a scan path changes during the setup time (i.e., the data input switches from the old value to the current value of the previous scan cell within the setup-time). As a result, the scan cell incorrectly captures an old value of the previous scan cell instead of the current value. A fault model used in simulation-based chain diagnosis may include slow-to-rise, slow-to-fall and slow-to-rise-and-fall fault types to represent this defect behavior.

The following discussion is in the context of localization of stuck-at and hold-time violations but is also applicable to other types of fault types. Desirable features for localization of multiple defects per chain include resolution, ability to handle many defects, and different defect types. Some DFD approaches use specific design modifications, specialized DRC and ATPG as well as using multiple test modes. In the early stages of developing a new technology, cell libraries may be incomplete and the flexibility for certain design modifications may be limited for test chips. Also, the highest demand for completeness of chain diagnosis is valid for test chips due to a limited sample.

Figure 3:
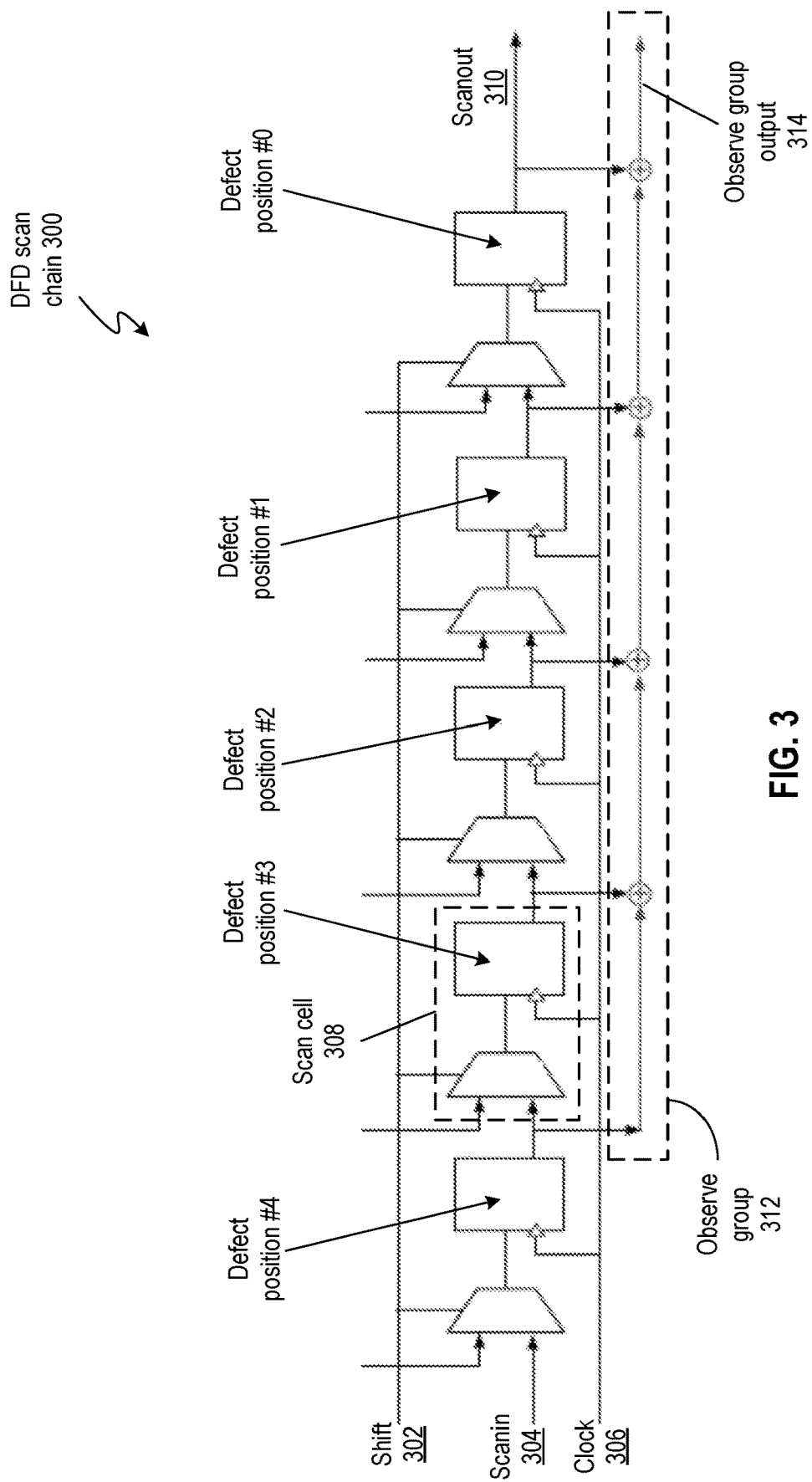
FIG. 3 illustrates a design for diagnosis (DFD) scan chain in accordance with some embodiments described herein.

FIG. 3 illustrates a DFD scan chain in accordance with some embodiments described herein.

DFD scan chain 300 may include scanin pin 304, a series of scan cells (e.g., scan cell 308), scanout pin 310, clock pin 306, and shift pin 302. Each scan cell (e.g., scan cell 308) may include a multiplexer and a register. Additionally, DFD scan chain 300 may include observe group 312 that includes logic to combine values of two or more scan cells during shift operation. For example, observe group 312 may perform an exclusive-OR operation on the register outputs. The observe-group output 314 may be unloaded instead of (or in addition to) the chain under test during shift operation. As a result, multiple measurements may be performed for observe group 312 of the DFD scan chains, where one measurement (i.e., one value of observe group output 314) may be performed per shift cycle.

DFD scan chain 300 may enable localization of a defective scan cell that is closest to scanin 304 (which may be referred to as an upper bound). For example, localization of a defective scan cell may be performed using the following operations: 1) loading all 0's by pattern 0 (initialization); 2) loading all 1's and unloading all 0's by pattern 1 (localization); and 3) loading all 0's and unloading all 1's by pattern 2 (localization).

The table shown below illustrates erroneous test responses for observe group output 314 for three fault types by using pattern 1. In the table shown below, (i) the first symbol reflects the capture values of all scan cells before the shift operation; and (ii) symbols P (pass) and F (fail) indicate that expected and measured values are same and opposite, respectively. Depending on the erroneous test response, the defect position may be localized as shown in the following table and FIG. 3.

| Defect position | Stuck-at-0 | Fast-to-rise | Slow-to-rise |
| --- | --- | --- | --- |
| 0 | <PPPPPF> | <PPPPFP> | <PPPPPF> |
| 1 | <PPPPFP> | <PPPFFP> | <PPPPFF> |
| 2 | <PPPFPF> | <PPFFFP> | <PPPFFF> |
| 3 | <PPFPFP> | <PFFFFP> | <PPFFFF> |
| 4 | <PFPFPF> | <FFFFFP> | <PFFFFF> |

Figure 4:
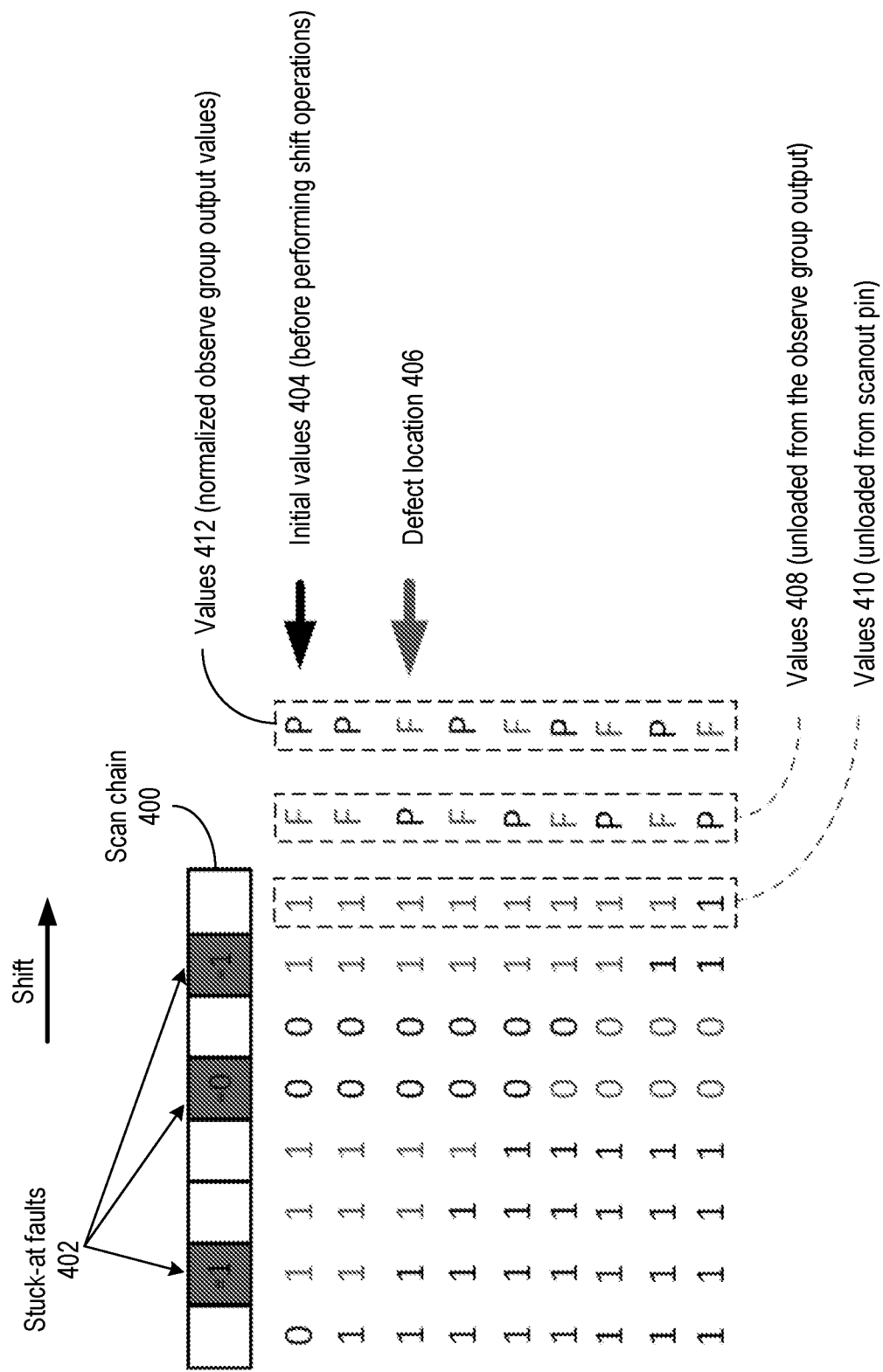
FIG. 4 illustrates a calculation of an upper bound when multiple stuck-at faults exist in a scan chain in accordance with some embodiments described herein.

FIG. 4 illustrates a calculation of an upper bound when multiple stuck-at faults exist in a scan chain in accordance with some embodiments described herein.

Scan chain 400 may be shifted from left to right and may include multiple stuck-at faults, e.g., stuck-at faults 402. The values stored in the scan chain after each shift operation are illustrated in FIG. 4. The top row may represent the initial values 404 before performing shift operations, and each successive row below the top row may represent the values in the scan cells after each shift operation. Values 410 may be unloaded from the scanout pin, values 408 may be unloaded from the observe group output. Values 408 (which were unloaded from the observe group output) may be normalized to obtain values 412. The upper bound may be determined based on values 412. Specifically, defect location 406 corresponds to the first "F" in values 412, which is the leftmost stuck-at fault defect (i.e., the upper bound). Thus, FIG. 4 illustrates how defect localization of stuck-at faults may be performed in the presence of multiple defects per chain. Some simulation-based methods may achieve localization for a defective scan cell that is closest to the scanout (referred as a lower bound).

Figure 5:
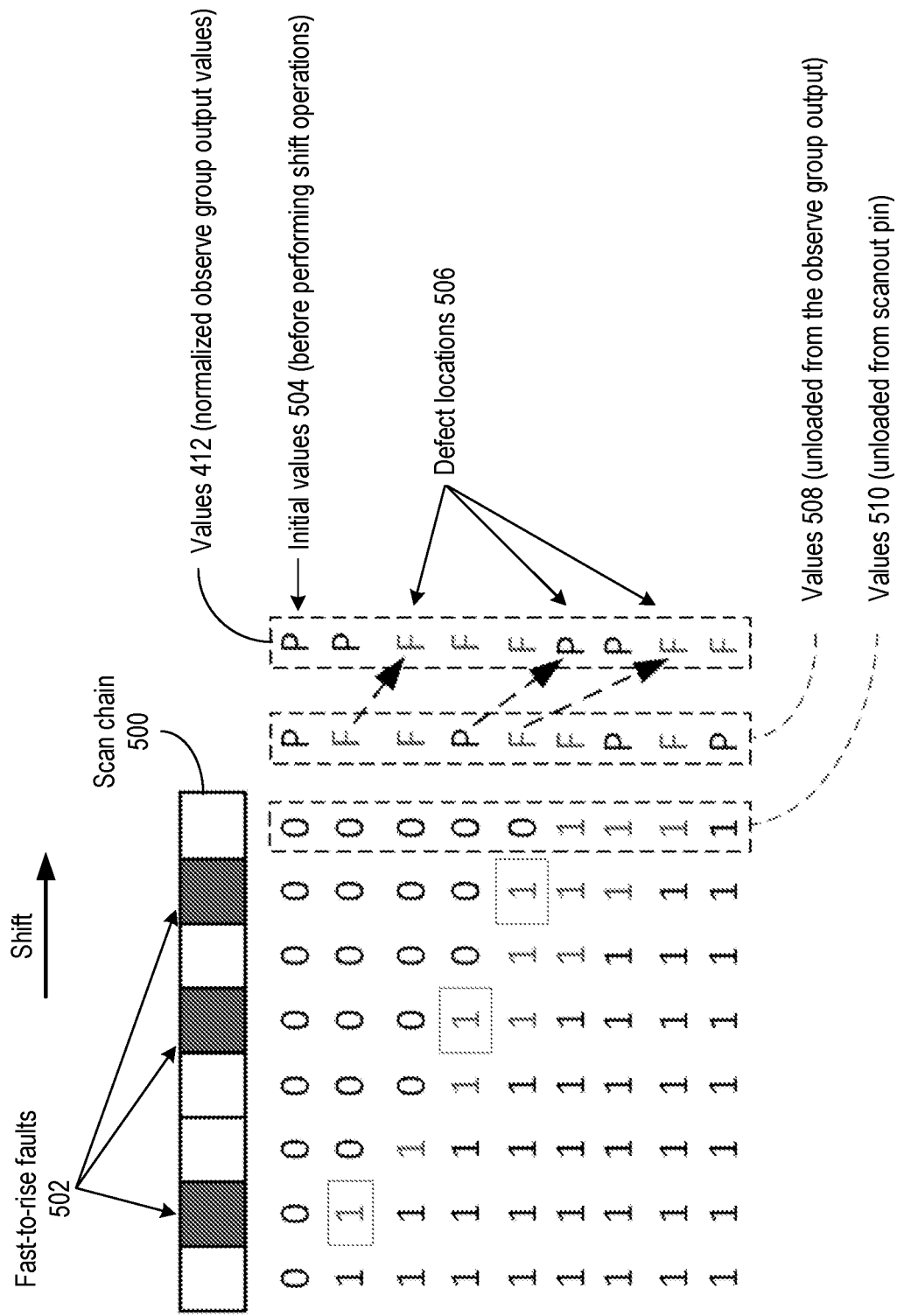
FIG. 5 illustrates localization of multiple fast-to-rise faults in a scan chain in accordance with some embodiments described herein.

FIG. 5 illustrates localization of multiple fast-to-rise faults in a scan chain in accordance with some embodiments described herein.

Scan chain 500 may be shifted from left to right and may include multiple fast-to-rise faults, e.g., fast-to-rise faults 402, which may cause hold timing violations. The values stored in the scan chain after each shift operation are illustrated in FIG. 5. The top row may represent the initial values 504 before performing shift operations, and each successive row below the top row may represent the values in the scan cells after each shift operation. Values 510 may be unloaded from the scanout pin, values 508 may be unloaded from the observe group output. Values 508 (which were unloaded from the observe group output) may be normalized to obtain values 512. The fast-to-rise defect locations may be determined based on values 512. Specifically, defect locations 506 correspond to the transitions between "P" and "F" in values 512 and identify the fast-to-rise defect locations in scan chain 500. Thus, FIG. 5 illustrates how defect localization of multiple fast-to-rise faults may be performed in a scan chain by using an observe group and multiple measurements per pattern (i.e., one measurement per shift operation).

Figure 6:
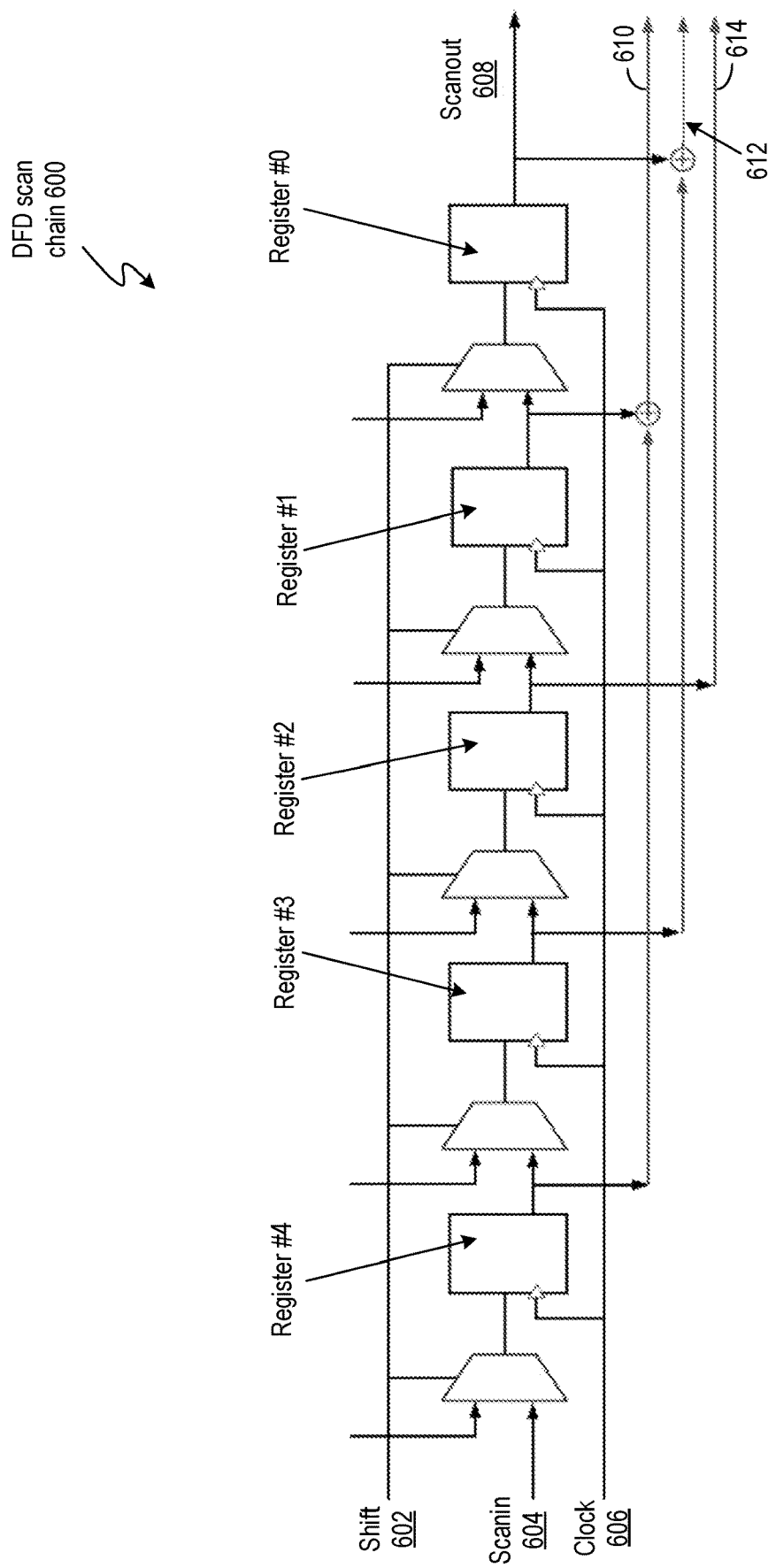
FIG. 6 illustrates a DFD approach that includes multiple observe groups per chain in accordance with some embodiments described herein.

FIG. 6 illustrates a DFD approach that includes multiple observe groups per chain in accordance with some embodiments described herein.

DFD scan chain 600 may include scanin pin 604, a series of scan cells, scanout pin 608, clock pin 606, and shift pin 602. Each scan cell may include a multiplexer and a register (e.g., registers #0-#4). Additionally, DFD scan chain 600 may include observe groups 610, 612, and 614 that includes logic to combine values of two or more scan cells during shift operation. Specifically, observe group 610 may perform an exclusive-OR operation on the outputs of registers #1 and #4, observe group 612 may perform an exclusive-OR operation on the outputs of registers #0 and #3, and observe group 614 may correspond to the output of register #2. The outputs of each observe group may be unloaded in each shift operation.

Figure 7:
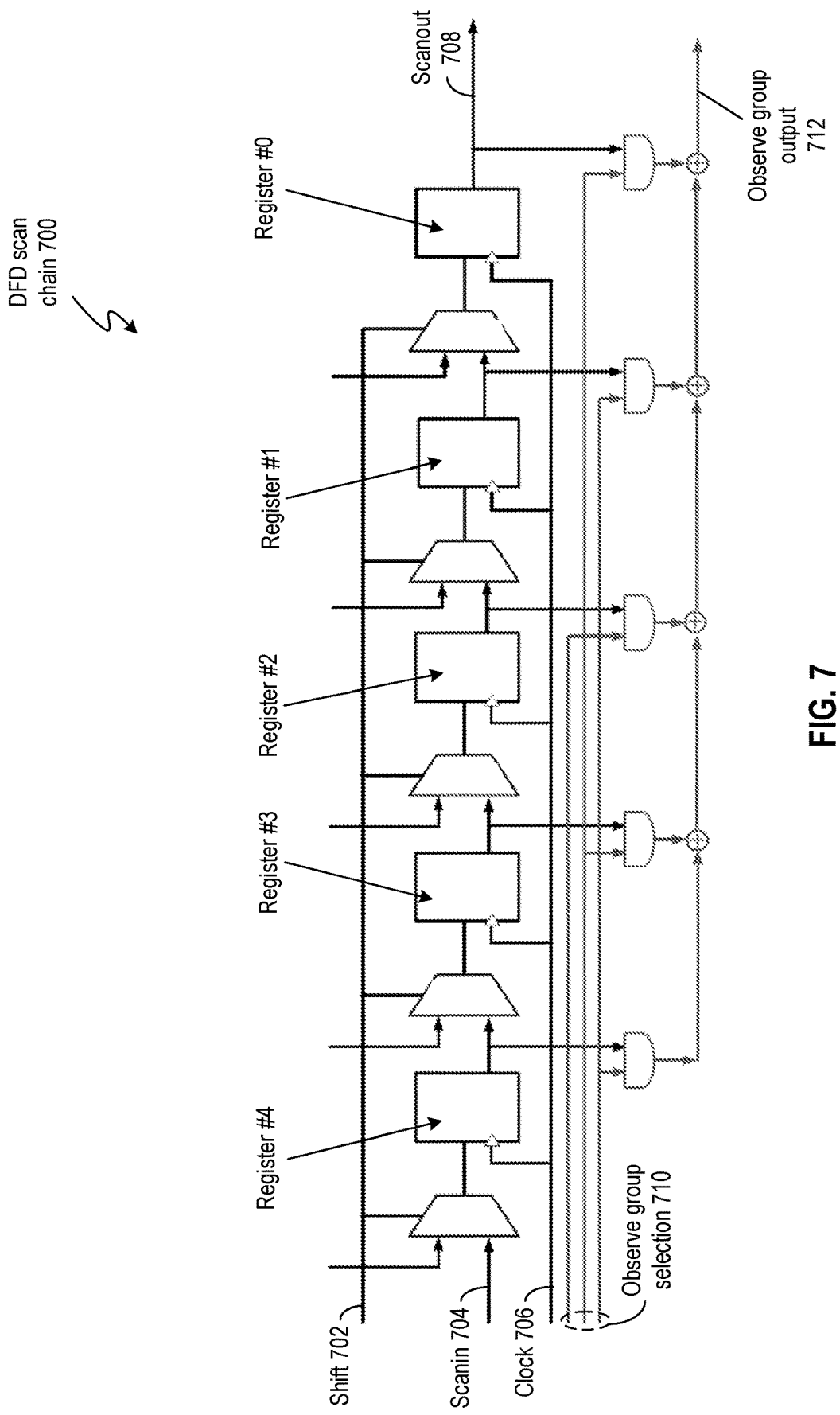
FIG. 7 illustrates a DFD approach that includes multiple observe groups per chain in accordance with some embodiments described herein.

FIG. 7 illustrates a DFD approach that includes multiple observe groups per chain in accordance with some embodiments described herein.

DFD scan chain 700 may include scanin pin 704, a series of scan cells, scanout pin 708, clock pin 706, and shift pin 702. Each scan cell may include a multiplexer and a register (e.g., registers #0-#4). Additionally, DFD scan chain 700 may include observe group selection pins 710 which may be used to select registers for the observe group. An exclusive-OR operation may be performed on the outputs of the selected registers and observe group output 712 may be unloaded in each shift operation.

Figure 8:
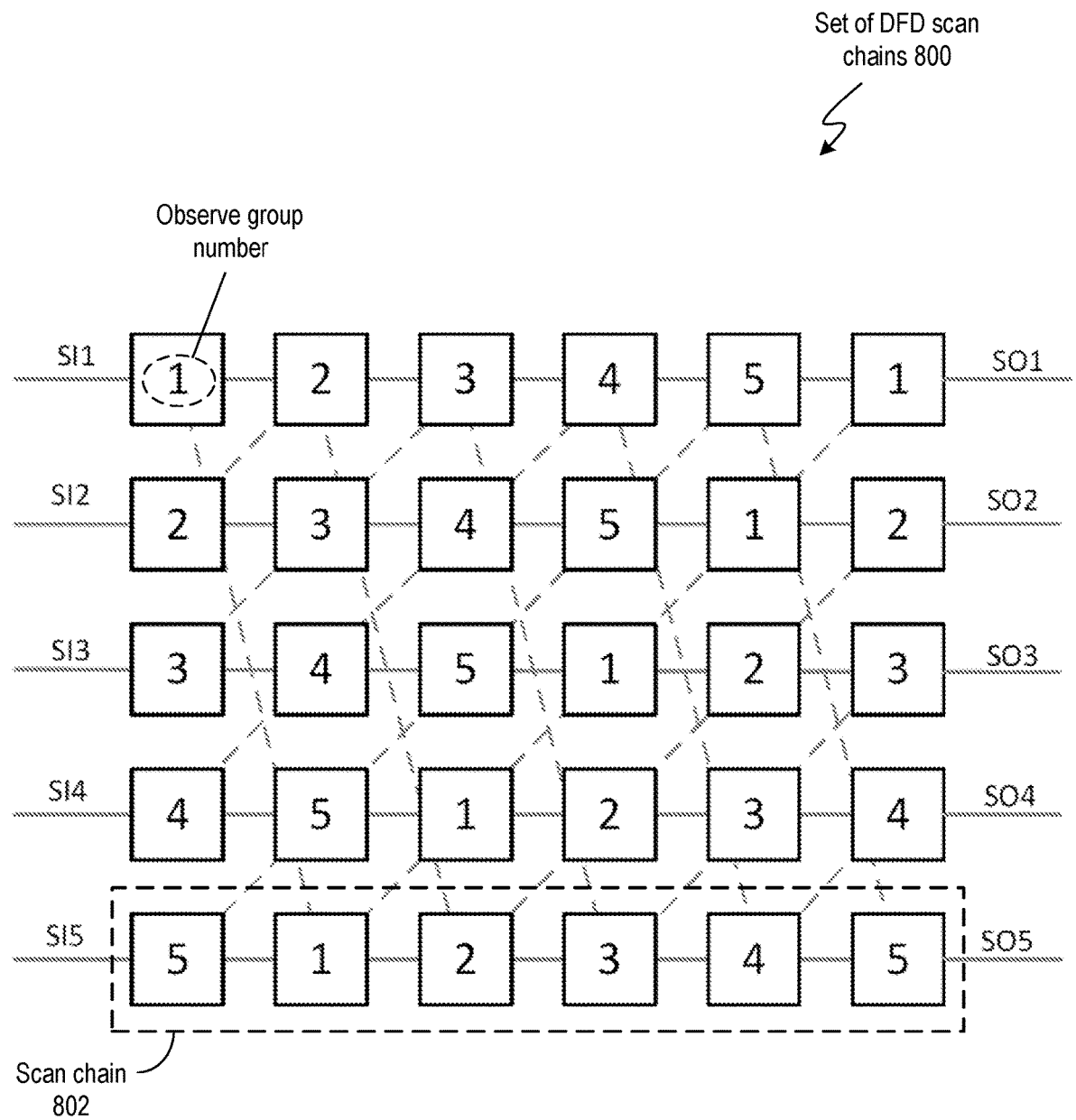
FIG. 8 illustrates a DFD approach that includes multiple observe groups per chain in accordance with some embodiments described herein.

FIG. 8 illustrates a DFD approach that includes multiple observe groups per chain in accordance with some embodiments described herein.

Set of DFD scan chains 800 include five scan chains, where each scan chain includes six scan cells. The scanin pins are labeled SI1 through SI5, and the scanout pins are labeled SO1 through SO5. Observe groups may be created by selecting scan cells from different scan chains and different shift positions. For example, five observe groups have been created in FIG. 8, where the observe group number is shown within each scan cell. The unload values of the scan cells in an observe group may be logically combined (e.g., by performing an exclusive-OR operation) and the observe group value may be used for defect localization. The approach shown in FIG. 8 enables localization of timing defects in up to n consecutive positions (where n is the number of observe groups) of a scan chain.

In some embodiments described herein, mutually orthogonal groups of scan cells may be created by grouping together scan cells that belong to the same shift cycle and scan cells that belong to the same observe group. A group of scan cells that belong to the same shift cycle may be referred to as a "control group" and a group of scan cells whose outputs are logically combined (e.g., by performing an exclusive-OR operation) may be referred to as an "observe group." In some embodiments described herein, (1) control groups may be non-overlapping with respect to each other, (2) observe groups may be non-overlapping with respect to each other, and (3) at most one scan cell may be shared between a control group and an observe group.

Figure 9:
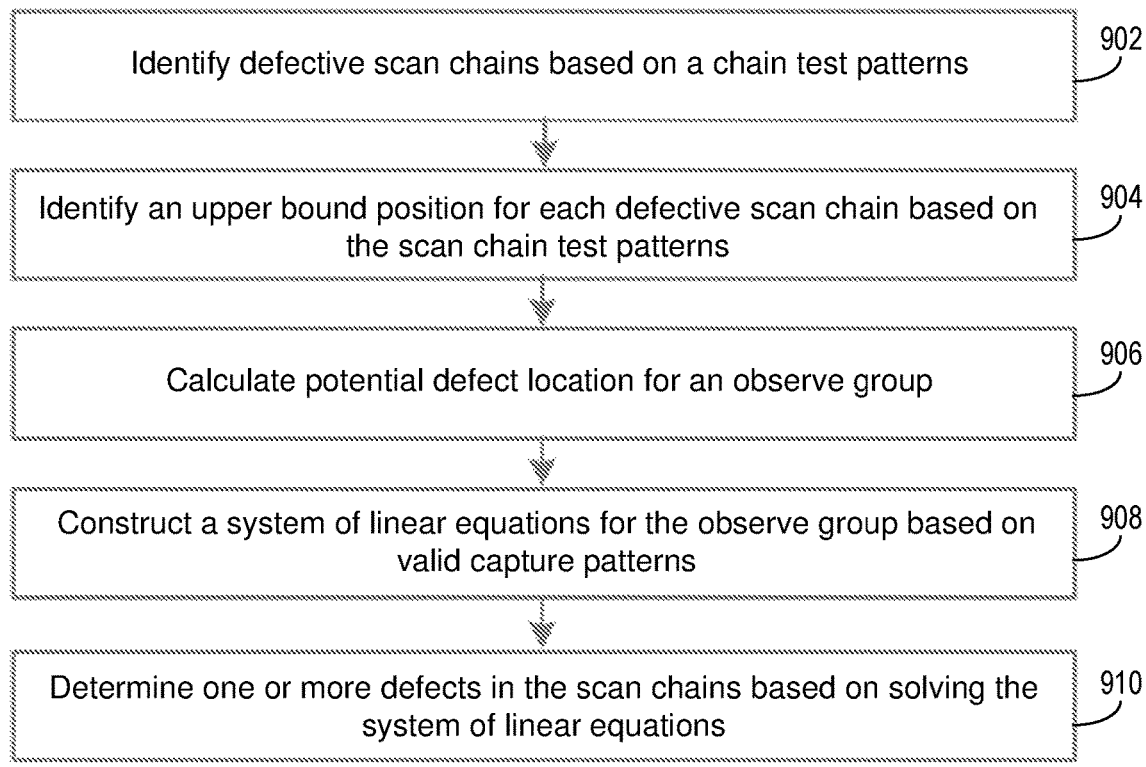
FIG. 9 illustrates a process for localization of multiple defects per chain based on capture patterns in accordance with some embodiments described herein.

FIG. 9 illustrates a process for localization of multiple defects per chain based on capture patterns in accordance with some embodiments described herein.

A single measurement per capture pattern may be performed, where the unloaded values from scan cells in an observe group may be logically combined (e.g., by performing an exclusive-OR operation). Defective scan chains may be identified based on chain test patterns (at 902). An upper bound position may be identified for each defective chain based on chain test patterns (at 904), e.g., by using the technique illustrated in FIG. 4. Potential defect locations may be calculated for each observe group (at 906). For example, potential defect locations may be calculated by performing an intersection of scan cells that belong to the observe group and the defective scan chain after the upper bound position. Valid capture patterns may be calculated for each observe group by simulating capture patterns and loading unknown values (i.e., "X" values) after the upper bound position in defective chains. A capture pattern is valid if at least all scan cells in the fault-free chains of this observe group have known capture values 0 or 1. Next, a system of linear equations may be constructed for each observe group (at 908). Specifically, each variable in the system of linear equations may represent potential faults within a corresponding observe group and each liner equation may correspond to a valid capture pattern. One or more defects in the scan chains may be determined based on solving the system of linear equations (at 910).

Defect localization may not be feasible if the number of defective scan chains is large and unknown values (i.e., "X" values) are loaded. In such situations, the process may use multiple passes, where in each pass, operations 908 and 910 may be applied for one observe group. Next, updated values of upper bound and lower bound positions may be used in fault simulation of successive passes for reducing the number of unknown values in the calculated capture values.

Figure 10:
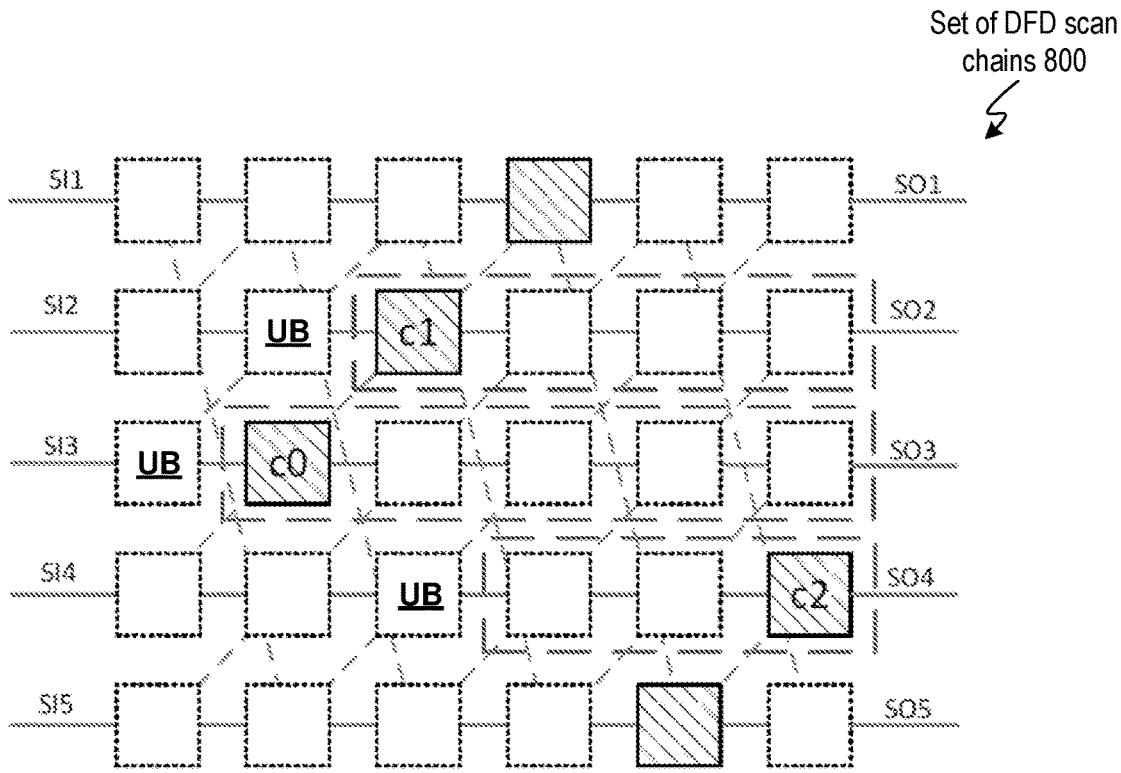
FIG. 10 illustrates defect localization in the presence of multiple defective chains and multiple defects per chain in accordance with some embodiments described herein.

FIG. 10 illustrates defect localization in the presence of multiple defective chains and multiple defects per chain in accordance with some embodiments described herein.

In set of DFD scan chains 800, let scan chains 2, 3 and 4 be defective (highlighted by dashed boxes) and their upper bounds (shown with the label "UB") be determined based on chain test patterns. Three potential defective locations of this observe-group may be highlighted and labeled as c0, c1 and c2. Let variables $x0(k)$ and $x1(k)$ represent stuck-at-0 fault and stuck-at-1 fault, respectively, for each defective scan cell ck where k={0, 1, 2}. A system of linear equations for each valid capture pattern includes variables $x0(k)$, $x1(k)$ or both $x0(k)$ an $x1(k)$ when the capture value of defective scan cell ck is 1, 0 or "X", respectively. A linear equation is equal to 0 or 1 when the corresponding unload value from the observe group is equal to or different than the expected value, respectively. A solution of the system of linear equations is any assignment of 0 or 1 to the variables which satisfies the system of linear equations. If a variable has a value 1 then the stuck-at fault corresponding to the variable exists. If the number of linear equations of a system of linear equations is much larger than the number of variables, then the system of linear equations most likely has a single solution. As a result, all defective scan cells within the corresponding observe group may uniquely located.

Figure 11:
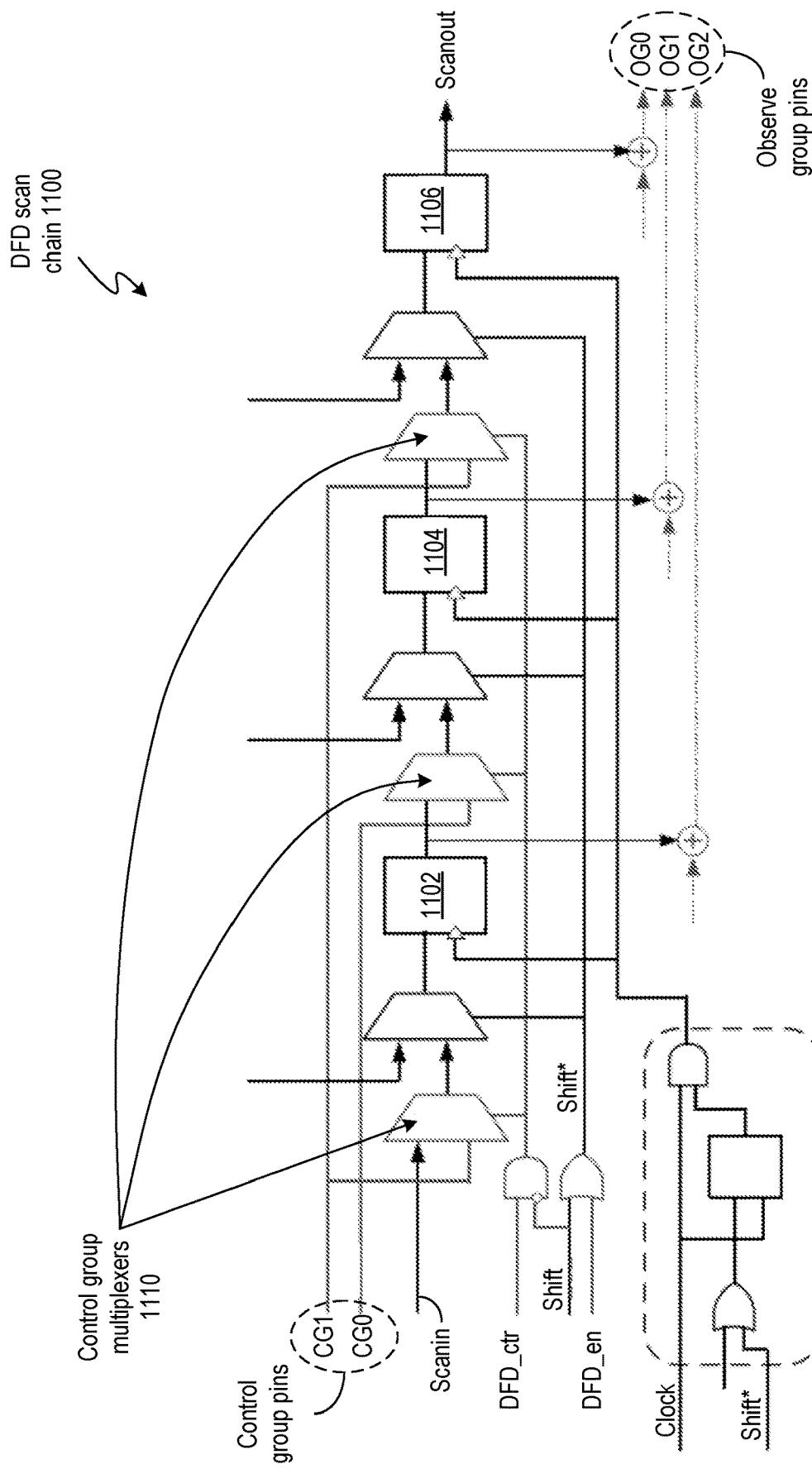
FIG. 11 illustrates a DFD scan chain that uses control groups and observe groups in accordance with some embodiments described herein.

FIG. 11 illustrates a DFD scan chain that uses control groups and observe groups in accordance with some embodiments described herein.

DFD scan chain 1100 includes three scan cells which include registers 1102, 1104, and 1106. Control group multiplexers 1110 may be used create two or more control groups. Scan cells that belong to a control group load data in the same shift cycle. For example, control group pin CG0 may be used to load data into register 1104, and control group pin CG1 may be used to load data into registers 1102 and 1106. A control group pin may also be referred to as a control point.

The outputs of registers that belong to the same observe group may be logically combined (e.g., by performing an exclusive-OR operation) and outputted at a pin corresponding to the observe group. For example, observe group pins OG0, OG1, and OG2 may be used to generate a value that combines the outputs of one or more registers. The circuitry that combines the output of the registers in an observe group is not shown in FIG. 11, but examples of such circuitry are shown in FIGS. 6-7.

Signals DFD_ctr and DFD_en may be used to control and enable DFD operation. The "Shift" signal may be used to determine whether the scan chain operates in a shift mode or in capture mode. The "Shift*" signal may be generated based on the "Shift" signal and the DFD_en signal. The "Shift*" signal may be used in clock gating circuitry 1108 which generates a clock signal that is provided to registers 1102, 1104, and 1106.

Scan cells of DFD scan chain 1100 may be divided into at least two control groups such that adjacent scan cells of each scan chain belong to different control groups. Specifically, when DFD_en=1, DFD_ctr=1, and shift=0, scan cells of each of at least two control groups receive input data from corresponding control points CG0 and CG1, respectively. The condition where DFD_en=1, DFD_ctr=1, and shift=0, may be referred hereafter as a sensitization condition. During the sensitization condition, specific predetermined values may be captured in the adjacent scan cells. If a specific sensitization condition is satisfied, then scan cells with stuck-at defects capture a fault effect (or incorrect value). As a result, the capture value of defective scan cells may not be equal to the expected capture value.

When DFD_en=1, DFD_ctr=0 and shift=0, DFD scan chain 1100 is operated in shift mode and each scan cell receives input data from the pervious scan cell. If a specific sensitization condition is satisfied, then scan cells with timing defects may capture a fault effect (i.e., an incorrect value). As a result, the capture value of defective scan cells may be different from the expected capture value. Thus, defect sensitization for stuck-at faults and timing defects may be performed by setting DFD_ctr=1 and DFD_ctr=0, respectively.

Figure 12:
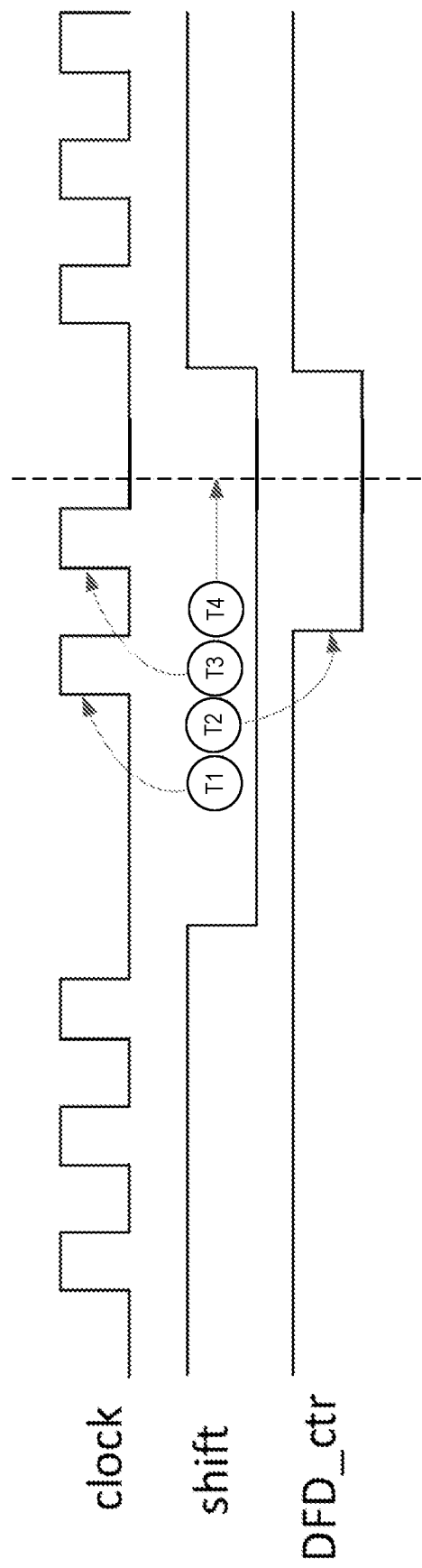
FIG. 12 shows a timing diagram of capture patterns for localization of timing defects in accordance with some embodiments described herein.

FIG. 12 shows a timing diagram of capture patterns for localization of timing defects in accordance with some embodiments described herein.

Time instances T1-T4 illustrate how timing defects can be localized. Time instance T1 corresponds to a first clock pulse, during which specific combinations of values may be captured in the adjacent scan cells (this may be referred to as sensitization condition). At time instance T2, DFD_ctr may be set to 0, which may cause the scan chain to be operated in shift mode. Time instance T3 corresponds to a second clock pulse. If the sensitization conditions are satisfied, then the defective scan cells capture fault effects (or incorrect values) at time instance T3 (which may be referred to as detection condition). At time instance T4, the output values of scan cells may be unloaded at the observe group output pins.

In some embodiments described herein, scan cells of a set of scan chains may be partitioned into at least two control groups of scan cells and at least two observe groups of scan cells. Specifically, the control groups may include a subset of scan cells in the set of scan cells for which defect localization is desired. Adjacent scan cells in the set of scan chains may belong to different control groups. For example, registers 1104 and 1106 in FIG. 11 correspond to different control groups. Each observe group may include at most one scan cell from each control group, and each control group may include at most one scan cell from each observe group. The control groups and observe groups may then be used to perform defect localization on the set of scan chains. The observe groups may include scan cells in different shift cycles and the defect localization may be performed based on multiple measurements per pattern from observe groups that includes a defective scan cell.

In some embodiments described herein, the control groups may be non-overlapping with each other, and the observe groups may be non-overlapping with each other. Two groups of scan cells are non-overlapping with each other if the two groups of scan cells do not have any common scan cells.

Defect localization may be performed on the set of scan chains by applying one or more capture patterns to the set of scan chains. Applying capture patterns may include (1) loading a first value corresponding to a capture pattern into scan cells of a control group, (2) applying at least one clock pulse to the set of scan chains, (3) combining outputs of scan cells of the observe group to generate an observe group output, and (4) unloading the observe group output. A clock pulse may be applied to the set of scan chains to perform a capture operation or a shift operation. During a capture operation, a scan cell receives input from functional logic, and during a shift operation, a scan cell receives input from a previous scan cell in the scan chain. Specifically, the scan cells in the control group may receive the first value during a first clock pulse. The set of scan cells may propagate data through the set of scan chains during a second clock pulse.

In some embodiments described herein, a system of linear equations may be created, where variables in the system of linear equations correspond to potential defect locations, equations in the system of linear equations correspond to capture patterns, and each equation of the system of linear equations includes variables that correspond to the potential defect locations that are detected by the corresponding capture pattern. Next, the system of linear equations may be solved to localize the defect.

FIG. 13 illustrates the sensitization conditions for different fault types in accordance with some embodiments described herein.

Columns labeled "s-a-0," "s-a-1," "s-t-r," "s-t-f," "s-t-rf," "f-t-r," "f-t-f," and "f-t-rf," may correspond to fault types stuck-at-0, stuck-at-1, slow-to-rise, slow-to-fall, slow-to-rise and fall, fast-to-rise, fast-to-fall, fast-to-rise and fall, respectively, and may correspond to variables x0 through x7. If the values shown in the column labeled "Comb" exist in three adjacent scan cells, then one or more the corresponding fault types are sensitized. As a result, a detection condition is satisfied, and an incorrect value is captured of the defective scan cell (highlighted with an underline in the "Comb" column). The column "linear equations" includes the set of linear equations. The set of linear equations may be solved to determine the type of fault at the defect location.

Figure 14:
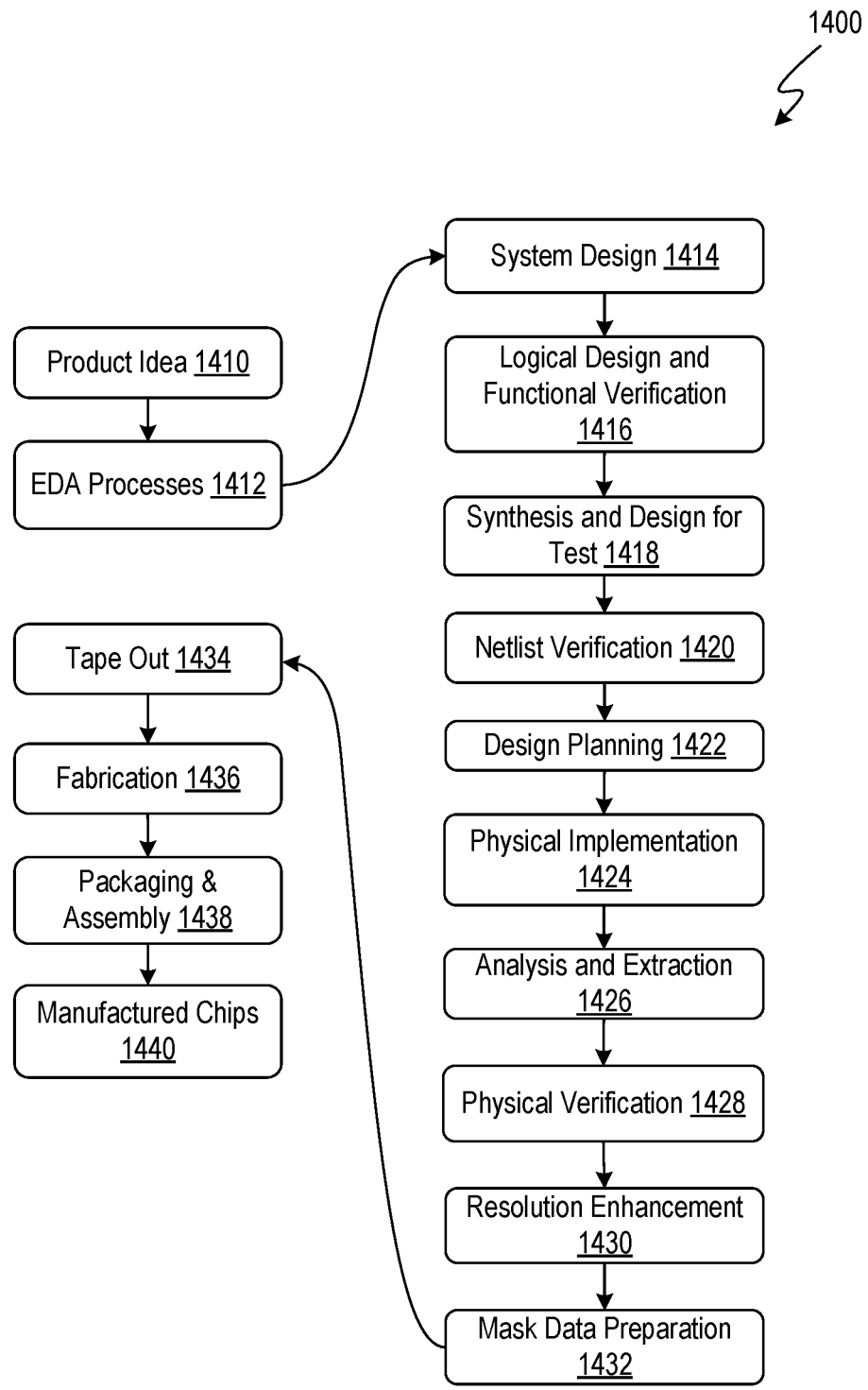
FIG. 14 illustrates an example flow for the design, verification, and fabrication of an integrated circuit in accordance with some embodiments described herein.

FIG. 14 illustrates an example flow for the design, verification, and fabrication of an integrated circuit in accordance with some embodiments described herein.

EDA processes 1412 (the acronym "EDA" refers to "Electronic Design Automation") can be used to transform and verify design data and instructions that represent the integrated circuit. Each of these processes can be structured and enabled as multiple modules or operations.

Flow 1400 can start with the creation of a product idea 1410 with information supplied by a designer, information which is transformed and verified by using EDA processes 1412. When the design is finalized, the design is taped-out 1434, which is when artwork (e.g., geometric patterns) for the integrated circuit is sent to a fabrication facility to manufacture the mask set, which is then used to manufacture the integrated circuit. After tape-out, a semiconductor die is fabricated 1436 and packaging and assembly 1438 are performed to produce the manufactured IC chip 1440.

Specifications for a circuit or electronic structure may range from low-level transistor material layouts to high-level description languages. A high-level of abstraction may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower abstraction level that is a less abstract description adds more detail into the design description. The lower levels of abstraction that are less abstract descriptions can be generated by a computer, derived from a design library, or created by another design automation process. An example of a specification language at a lower level of abstraction language for specifying more detailed descriptions is SPICE (which stands for "Simulation Program with Integrated Circuit Emphasis"). Descriptions at each level of abstraction contain details that are sufficient for use by the corresponding tools of that layer (e.g., a formal verification tool).

During system design 1414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1416, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as test-bench generators, static HDL checkers, and formal verifiers. In some embodiments, special systems of components referred to as 'emulators' or 'prototyping systems' are used to speed up the functional verification.

During synthesis and design for test 1418, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1420, the netlist is checked for compliance with timing constraints and for correspondence with the HDL code. During design planning 1422, an overall floor plan for the integrated circuit is constructed and analyzed for timing and top-level routing.

During layout or physical implementation 1424, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1426, the circuit function is verified at the layout level, which permits refinement of the layout design. During physical verification 1428, the layout design is checked to ensure that manufacturing constraints are correct, such as DRC constraints, electrical constraints, lithographic constraints, and that circuitry function matches the HDL design specification. During resolution enhancement 1430, the geometry of the layout is transformed to improve how the circuit design is manufactured.

During tape-out, data is created to be used (after lithographic enhancements are applied if appropriate) for production of lithography masks. During mask data preparation 1432, the 'tape-out' data is used to produce lithography masks that are used to produce finished integrated circuits.

A storage subsystem of a computer system (such as computer system 1500 in FIG. 15) may be used to store the programs and data structures that are used by some or all of the EDA products described herein, and products used for development of cells for the library and for physical and logical design that use the library.

Figure 15:
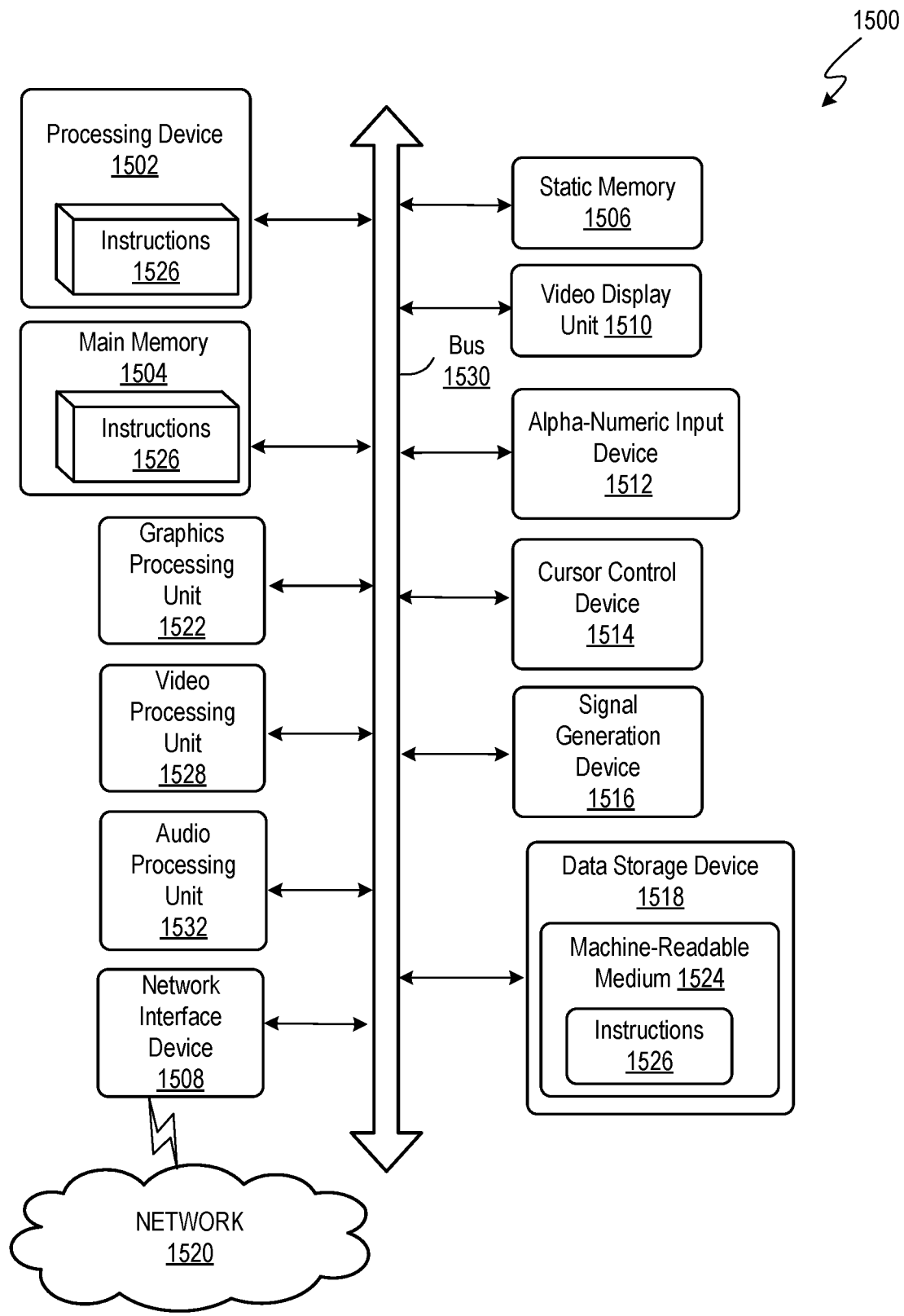
FIG. 15 illustrates an example machine of a computer system within which a set of instructions, for causing the machine to perform any one or more of the methodologies discussed herein, may be executed in accordance with some embodiments described herein.

FIG. 15 illustrates an example machine of a computer system 1500 within which a set of instructions, for causing the machine to perform any one or more of the methodologies discussed herein, may be executed.

In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1500 includes a processing device 1502, a main memory 1504 (e.g., read-only memory (ROM), flash memory, dynamic random access memory (DRAM) such as synchronous DRAM (SDRAM), a static memory 1506 (e.g., flash memory, static random access memory (SRAM), etc.), and a data storage device 1518, which communicate with each other via a bus 1530.

Processing device 1502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1502 may also be one or more special-purpose processing devices such as an application specific integrated circuit (ASIC), a field programmable gate array (FPGA), a digital signal processor (DSP), network processor, or the like. The processing device 1502 may be configured to execute instructions 1526 for performing the operations and steps described herein.

The computer system 1500 may further include a network interface device 1508 to communicate over the network 1520. The computer system 1500 also may include a video display unit 1510 (e.g., a liquid crystal display (LCD) or a cathode ray tube (CRT)), an alphanumeric input device 1512 (e.g., a keyboard), a cursor control device 1514 (e.g., a mouse), a graphics processing unit 1522, a signal generation device 1516 (e.g., a speaker), graphics processing unit 1522, video processing unit 1528, and audio processing unit 1532.

The data storage device 1518 may include a machine-readable storage medium 1524 (also known as a non-transitory computer-readable medium) on which is stored one or more sets of instructions 1526 or software embodying any one or more of the methodologies or functions described herein. The instructions 1526 may also reside, completely or at least partially, within the main memory 1504 and/or within the processing device 1502 during execution thereof by the computer system 1500, the main memory 1504 and the processing device 1502 also constituting machine-readable storage media.

In some implementations, the instructions 1526 include instructions to implement functionality corresponding to the present disclosure. While the machine-readable storage medium 1524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various design modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
    partitioning scan cells of a set of scan chains into at least two control groups of scan cells and at least two observe groups of scan cells, wherein adjacent scan cells in the set of scan chains belong to different control groups, wherein each observe group includes at most one scan cell from each control group, and wherein each control group includes at most one scan cell from each observe group; and
    using the control groups and observe groups to perform defect localization on the set of scan chains.

2. The method of claim 1, wherein the at least two observe groups comprise scan cells in different shift cycles and the defect localization is performed based on multiple measurements per pattern from observe groups that comprise a defective scan cell.

3. The method of claim 1, wherein the control groups are non-overlapping with each other, and wherein the observe groups are non-overlapping with each other.

4. The method of claim 1, wherein the using the control groups and observe groups to perform defect localization on the set of scan chains comprises applying one or more capture patterns to the set of scan chains.

5. The method of claim 4, wherein applying one or more capture patterns to the set of scan chains comprises:
    loading a first value corresponding to a capture pattern into scan cells of a control group;
    applying at least one clock pulse to the set of scan chains;
    combining outputs of scan cells of the observe group to generate an observe group output; and
    unloading the observe group output.

6. The method of claim 5, wherein the scan cells in the control group receive the first value during a first clock pulse.

7. The method of claim 6, wherein the set of scan cells propagate data through the set of scan chains during a second clock pulse.

8. The method of claim 4, wherein the using the control groups and observe groups to perform defect localization on the set of scan chains comprises:
    creating a system of linear equations, wherein variables in the system of linear equations correspond to potential defect locations, wherein equations in the system of linear equations correspond to capture patterns, and wherein each equation of the system of linear equations includes variables that correspond to the potential defect locations that are detected by the corresponding capture pattern; and
    solving the system of linear equations.

9. The method of claim 1, wherein the control groups comprise a subset of scan cells in the set of scan cells.

10. A non-transitory computer readable storage medium storing instructions, which when executed by a processor, cause the processor to:
    partition scan cells of a set of scan chains into at least two control groups of scan cells and at least two observe groups of scan cells, wherein adjacent scan cells in the set of scan chains belong to different control groups, wherein each observe group includes at most one scan cell from each control group, and wherein each control group includes at most one scan cell from each observe group; and
    use the control groups and observe groups to perform defect localization on the set of scan chains.

11. The non-transitory computer readable storage medium storing instructions of claim 10, wherein the at least two observe groups comprise scan cells in different shift cycles and the defect localization is performed based on multiple measurements per pattern from observe groups that comprise a defective scan cell.

12. The non-transitory computer readable storage medium storing instructions of claim 10, wherein the control groups are non-overlapping with each other, and wherein the observe groups are non-overlapping with each other.

13. The non-transitory computer readable storage medium storing instructions of claim 10, wherein the using the control groups and observe groups to perform defect localization on the set of scan chains comprises applying one or more capture patterns to the set of scan chains.

14. The non-transitory computer readable storage medium storing instructions of claim 13, wherein applying one or more capture patterns to the set of scan chains comprises:
- loading a first value corresponding to a capture pattern into scan cells of a control group;
- applying at least one clock pulse to the set of scan chains;
- combining outputs of scan cells of the observe group to generate an observe group output; and
- unloading the observe group output.

15. The non-transitory computer readable storage medium storing instructions of claim 14, wherein the scan cells in the control group receive the first value during a first clock pulse.

16. The non-transitory computer readable storage medium storing instructions of claim 15, wherein the set of scan cells propagate data through the set of scan chains during a second clock pulse.

17. The non-transitory computer readable storage medium storing instructions of claim 13, wherein the using the control groups and observe groups to perform defect localization on the set of scan chains comprises:
- creating a system of linear equations, wherein variables in the system of linear equations correspond to potential defect locations, wherein equations in the system of linear equations correspond to capture patterns, and wherein each equation of the system of linear equations includes variables that correspond to the potential defect locations that are detected by the corresponding capture pattern; and
- solving the system of linear equations.

18. The non-transitory computer readable storage medium storing instructions of claim 10, wherein the control groups comprise a subset of scan cells in the set of scan cells.

19. An apparatus, comprising:
- a memory storing instructions; and
- a processor, coupled with the memory and to execute the instructions, the instructions when executed causing the processor to:
  - partition scan cells of a set of scan chains into at least two observe groups of scan cells;
  - load a first value corresponding to a capture pattern into one or more scan cells;
  - apply at least one clock pulse to the set of scan chains;
  - combine outputs of scan cells of a first observe group to generate a first observe group output;
  - unload the first observe group output; and
  - perform defect localization on the set of scan chains based on the first observe group output.

20. The apparatus of claim 19, wherein the observe groups are non-overlapping with each other.

* * * * *